(12) United States Patent
Kalburge et al.

(10) Patent No.: US 6,809,353 B2
(45) Date of Patent: Oct. 26, 2004

(54) METHOD FOR FABRICATING A SELF-ALIGNED BIPOLAR TRANSISTOR WITH PLANARIZING LAYER AND RELATED STRUCTURE

(75) Inventors: Amol M Kalburge, Irvine, CA (US); Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/442,489

(22) Filed: May 21, 2003

(65) Prior Publication Data

US 2004/0140530 A1 Jul. 22, 2004

Related U.S. Application Data

(63) Continuation-in-part of application No. 10/218,527, filed on Aug. 13, 2002, and a continuation-in-part of application No. 09/721,344, filed on Nov. 22, 2000, now Pat. No. 6,534,372.

(51) Int. Cl.[7] .................... H01L 31/0328; H01L 21/331
(52) U.S. Cl. ................ 257/197; 257/554; 257/565; 438/339; 438/364; 438/366
(58) Field of Search ................ 257/197, 200, 257/201, 554, 564–566, 574, 578, 592; 438/309, 339, 345, 359, 364, 366

(56) References Cited

U.S. PATENT DOCUMENTS

| | | | | |
|---|---|---|---|---|
| 6,586,307 B1 | * | 7/2003 | Kalburge et al. | 438/364 |
| 6,590,265 B2 | * | 7/2003 | Thomas | 257/369 |
| 6,597,022 B1 | * | 7/2003 | Schuegraf | 257/183 |
| 6,617,619 B1 | * | 9/2003 | U'Ren et al. | 257/183 |

* cited by examiner

Primary Examiner—Kevin M. Picardat
(74) Attorney, Agent, or Firm—Farjami & Farjami LLP (57) ABSTRACT

According to one exemplary embodiment, a bipolar transistor comprises a base having a top surface. The bipolar transistor further comprises first and second link spacers situated on the top surface of the base. The bipolar transistor further comprises a sacrificial post situated on the top surface of the base between the first and second link spacers. The first and second link spacers may have a height, for example, approximately equal to or, in another embodiment, substantially less than a height of the sacrificial post. According to this exemplary embodiment, the bipolar transistor further comprises a non-sacrificial planarizing layer situated over the sacrificial post, first and second link spacers, and base. The non-sacrificial planarizing layer may comprise, for example, silicate glass. The sacrificial planarizing layer may have a height, for example, approximately equal to or, in another embodiment, greater than greater than a height of the first and second link spacers.

27 Claims, 6 Drawing Sheets

METHOD FOR FABRICATING A SELF-ALIGNED BIPOLAR TRANSISTOR WITH PLANARIZING LAYER AND RELATED STRUCTURE

This application is a continuation in part of, and claims benefit of the filing date of, and hereby incorporates fully by reference, a pending parent application entitled "Method for Fabricating a Self-Aligned Bipolar Transistor and Related Structure," Ser. No. 10/218,527 filed Aug. 13, 2002, and assigned to the assignee of the present application. This application also hereby incorporates fully by reference a related U.S. patent application entitled "Method for Fabricating a Self-Aligned Emitter in a Bipolar Transistor" Ser. No. 09/721,344 filed Nov. 22, 2000, issued as U.S. Pat. No. 6,534,372, and assigned to the assignee of the present application.

BACKGROUND OF THE INVENTION

1. Field of the Invention

The present invention relates to the field of fabrication of semiconductor devices. More specifically, the invention relates to the fabrication of bipolar transistors.

2. Background Art

As modern electronic devices increase in speed while decreasing in size and price, semiconductor manufacturers are challenged to provide low-cost, high speed, and small size transistors for these devices. To meet this challenge, semiconductor manufacturers must accurately control the size of certain features that critically affect the performance of transistors on a semiconductor wafer, such as emitter widths of bipolar transistors. Furthermore, various parts of the bipolar transistor must be properly aligned to ensure that the bipolar transistor meets performance requirements. For example, the emitter and the extrinsic base implant in a heterojunction bipolar transistor (HBT) must be properly aligned to prevent an undesirable increase in base resistance.

In one conventional fabrication process for a bipolar transistor, such as an HBT, semiconductor manufacturers utilize a first photomask to control the bipolar transistor's emitter width, which is generally referred to as a critical dimension, or "CD." A second photomask, which must be properly aligned with the first photomask, is utilized to determine the boundaries of the heavily doped extrinsic base regions of the bipolar transistor. Misalignment of the two photomasks causes, among other things, the distance across the link base region of the bipolar transistor, i.e. the region between the base-emitter junction and the extrinsic base region, to vary in an unpredictable fashion. Since there need be a margin for error in the alignment of the two photomasks, the distance across the link base region must be increased to account for such misalignment. This results, for example, in an undesirable increase in base resistance. Additionally, in the two-photomask fabrication process described above, the first photomask must be accurately controlled to control the emitter width of the bipolar transistor. Also, misalignment of the two photomasks can cause an undesirable reduction in manufacturing yield, which can cause a corresponding increase in manufacturing cost.

Other fabrication processes and tools have been tried in attempts to solve the problem of aligning the link base and extrinsic base to the emitter in bipolar transistor devices. One approach requires the use of selective epitaxy along with the use of an inside spacer. Selective epitaxy presents a problem in that it is not currently used in high volume production of semiconductor devices. Selective epitaxy presents another problem in that selective epitaxial deposition occurs only on silicon regions and not on oxide regions. Since most process monitoring is done on oxide regions, selective epitaxy results in a substantial loss of process monitoring capability. Use of an inside spacer presents a further problem in that variability of emitter width is greater than with other methods, so some accuracy in control of emitter width is lost.

In addition, as feature sizes of bipolar devices are reduced, it is important and more difficult to achieve accurate control over the size of certain features, such as the emitter width of the bipolar transistor.

Thus, there is need in the art for a fabrication process for bipolar transistors which does not rely on the alignment of separate photomasks to form the link base region, the intrinsic base region, the base-emitter junction, and to implant the heavily doped extrinsic base region.

SUMMARY OF THE INVENTION

The present invention is directed to method for fabricating a self-aligned bipolar transistor with planarizing layer and related structure. The present invention addresses and resolves the need in the art for a fabrication process for bipolar transistors which does not rely on the alignment of separate photomasks to form the link base region, the intrinsic base region, the base-emitter junction, and to implant the heavily doped extrinsic base region of the bipolar transistor.

According to one exemplary embodiment, a bipolar transistor comprises a base having a top surface. The bipolar transistor further comprises a first link spacer and a second link spacer situated on the top surface of the base. The bipolar transistor further comprises a sacrificial post situated on the top surface of the base between the first link spacer and the second link spacer. The first and second link spacers may have a height, for example, approximately equal to or, in another embodiment, substantially less than a height of the sacrificial post.

According to this exemplary embodiment, the bipolar transistor further comprises a non-sacrificial planarizing layer situated over the sacrificial post, the first and second link spacers, and the base. The non-sacrificial planarizing layer may comprise, for example, silicate glass. The sacrificial planarizing layer may have a height, for example, that is approximately equal to or, in another embodiment, greater than a height of the first and second link spacers. The bipolar transistor may further comprise a mask situated over the non-sacrificial planarizing layer, where the mask has an emitter window opening. In another embodiment, the present invention is a method that achieves the above-described bipolar transistor. Other features and advantages of the present invention will become more readily apparent to those of ordinary skill in the art after reviewing the following detailed description and accompanying drawings.

DETAILED DESCRIPTION OF THE INVENTION

The present invention is directed to method for fabricating a self-aligned bipolar transistor with planarizing layer and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
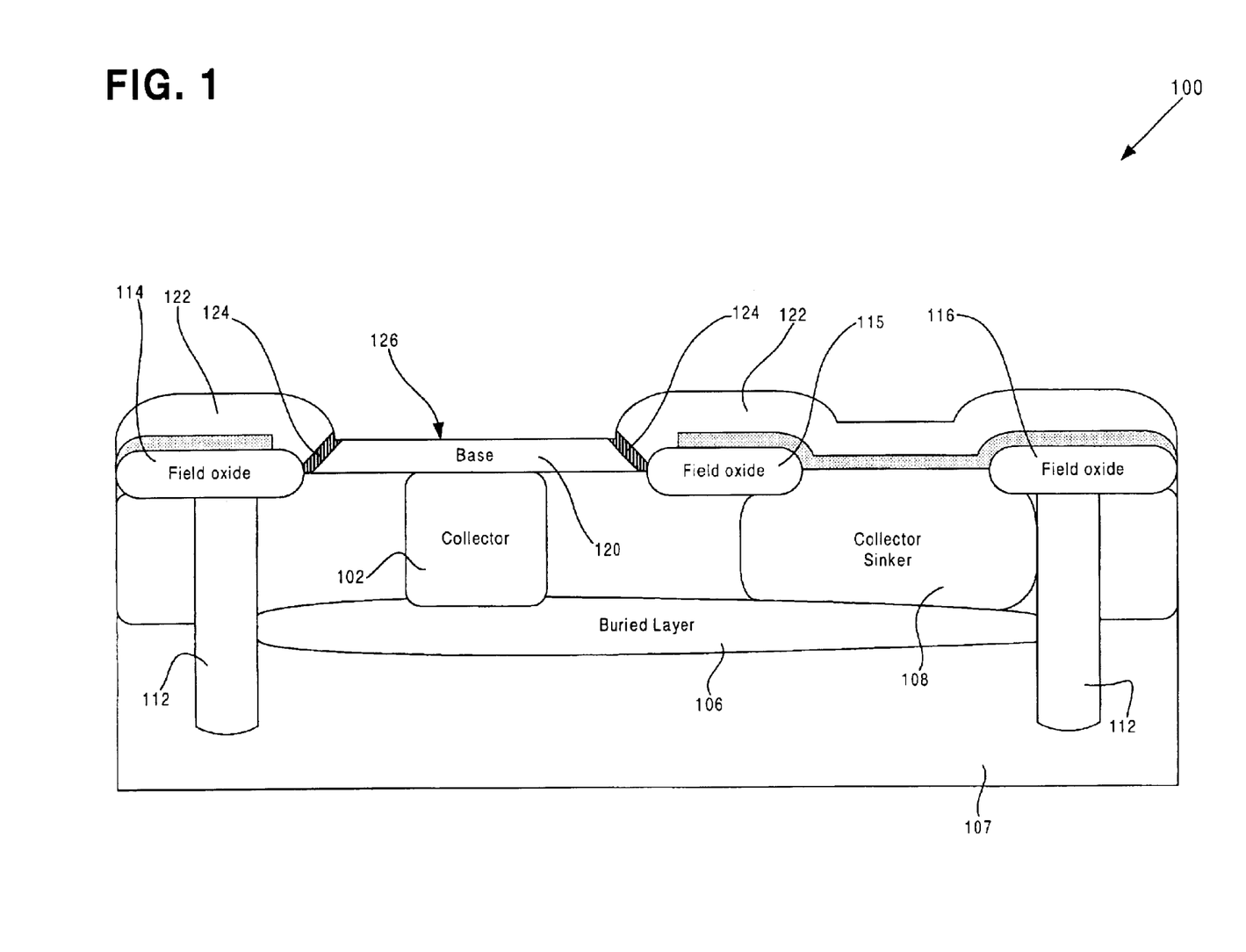
FIG. 1 illustrates a cross-sectional view of some of the features of an exemplary bipolar transistor prior to application of the steps taken to implement an embodiment of the present invention.

FIG. 1 shows exemplary structure 100, which is utilized to describe an exemplary embodiment of the present invention. Certain details and features have been left out of FIG. 1, which are apparent to a person of ordinary skill in the art. Structure 100 includes collector 102 and base 120 for a bipolar transistor. The present invention applies, in general, to any bipolar transistor, including a heterojunction bipolar transistor ("HBT"). For example, the present invention applies to NPN or PNP HBTs comprising silicon, silicon-germanium, gallium-arsenide, or other materials. In particular, the present invention applies to silicon-germanium-carbon HBTs where carbon is used as a diffusion suppressant. However, the present application makes specific reference to a silicon-germanium ("SiGe") NPN bipolar transistor as an aid to describe an embodiment of the present invention. In the present embodiment, collector 102 is N type single crystal silicon that can be formed using a dopant diffusion process in a manner known in the art. In the present embodiment, base 120 is P-type SiGe single crystal that might be deposited epitaxially in a low-pressure chemical vapor deposition ("LPCVD") process. Base 120 may be implanted with boron ions to achieve the aforementioned P-type doping. As seen in FIG. 1, base 120 is situated on top of, and forms a junction with, collector 102. In the present embodiment, base contact 122 is polycrystalline SiGe that may be deposited epitaxially in a LPCVD process. Base 120 and base contact 122 connect with each other at interface 124 between the contact polycrystalline material and the base single crystal material. Base 120 has a top surface 126.

As seen in FIG. 1, buried layer 106, which is composed of N+ type material, i.e. it is relatively heavily doped N type material, is formed in silicon substrate 107 in a manner known in the art. Collector sinker 108, also comprised of N+ type material, is formed by diffusion of heavily concentrated dopants from the surface of collector sinker 108 down to buried layer 106. Buried layer 106, along with collector sinker 108, provide a low resistance electrical pathway from collector 102 through buried layer 106 and collector sinker 108 to a collector contact (the collector contact is not shown in FIG. 1). Deep trenches 112 and field oxide isolation regions 114, 115, and 116 may be composed of silicon dioxide ($SiO_2$) material and are formed in a manner known in the art. Deep trenches 112 and field oxide isolation regions 114, 115, and 116 provide electrical isolation from other devices on silicon substrate 107 in a manner known in the art. Thus, FIG. 1 shows that structure 100 includes several features and components used to form a bipolar transistor at a stage prior to formation of an emitter comprised of N type polycrystalline silicon above base 120.

Figure 2:
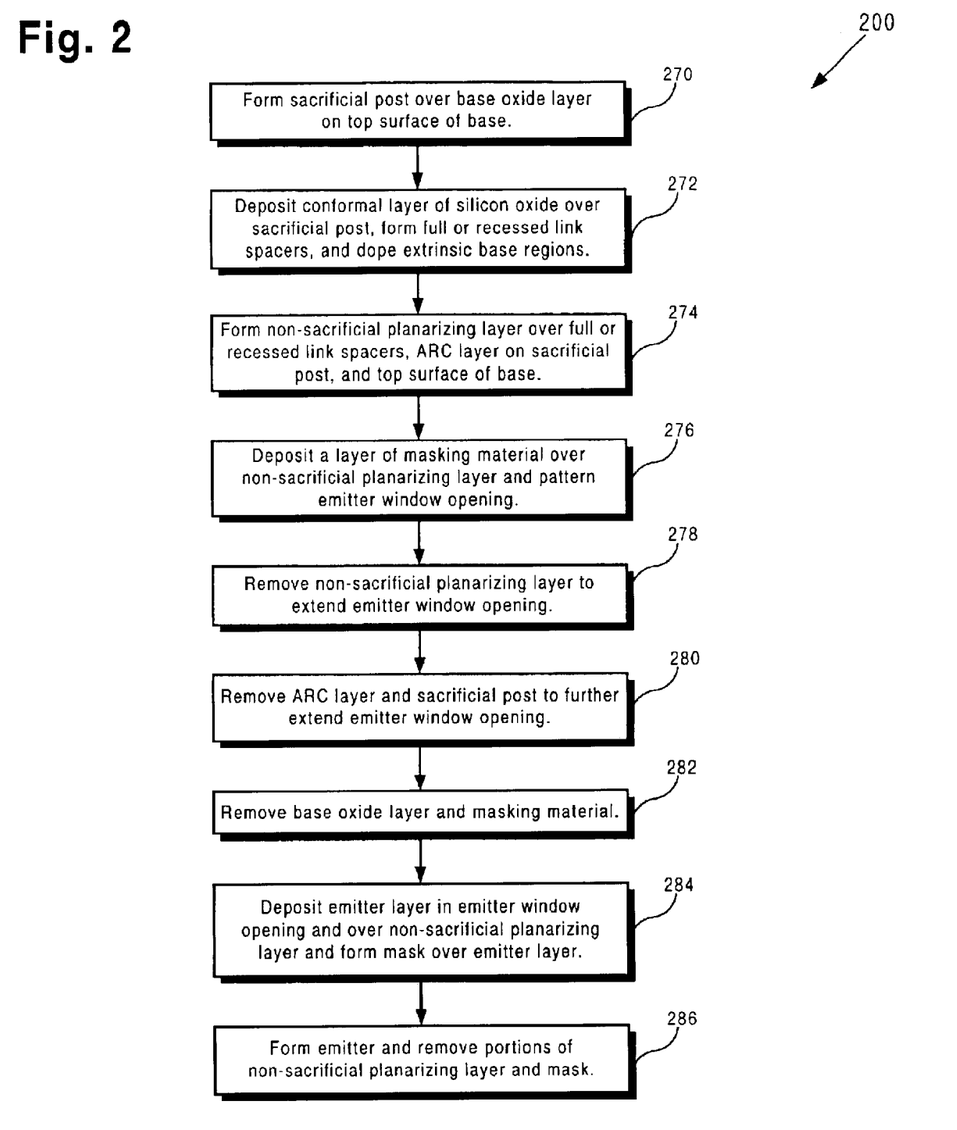
FIG. 2 shows a flowchart illustrating the steps taken to implement an embodiment of the present invention.

FIG. 2 shows flowchart 200, which describes the steps, according to one embodiment of the present invention, in the processing of a wafer that includes structure 100. Certain details and features have been left out of flowchart 200 that are apparent to a person of ordinary skill in the art. For example, a step may consist of one or more substeps or may involve specialized equipment or materials, as known in the art.

While steps 270 through 286 indicated in flowchart 200 are sufficient to describe one embodiment of the present invention, other embodiments of the invention may utilize steps different from those shown in flowchart 200. It is noted that the processing steps shown in flowchart 200 are performed on a wafer, which, prior to step 270, includes structure 100 shown in FIG. 1. In particular, the wafer includes top surface 126 of base 120 on which formation of an emitter comprised of N type polycrystalline silicon is to take place in an "emitter window opening."

Figure 3A:
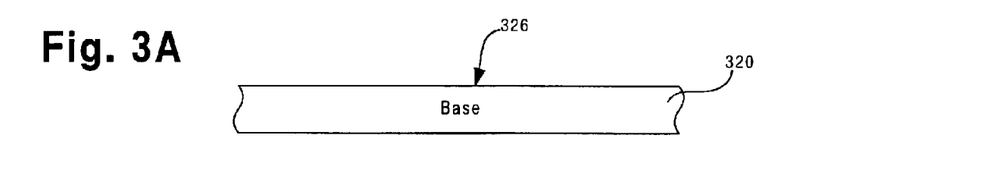
FIG. 3A illustrates a cross-sectional view, which includes a portion of a wafer processed according to an embodiment of the invention.

Referring now to FIG. 3A, structure 300 of FIG. 3A shows a portion of structure 100 of FIG. 1. Base 120 and top surface 126 of structure 100 are shown in structure 300 as base 320 and top surface 326, respectively. For simplicity, other features such as base contact 122, interface 124, collector 102, buried layer 106, silicon substrate 107, collector sinker 108, deep trenches 112, and field oxide regions 114, 115, and 116, are not shown in structure 300. Structure 300 thus shows the portion of a wafer including top surface 326 of base 320, on which the formation of an emitter comprised of N type polycrystalline silicon is to take place in an emitter window opening, before processing the wafer according to one embodiment of the invention shown in flowchart 200 of FIG. 2. In particular, structure 300 shows a portion of the wafer before processing step 270 of flowchart 200.

Referring to FIGS. 3B through 3K, structures 370, 372a and 372b, 374, 376, 378, 380, 382, 384, and 386 illustrate the result of performing, on structure 300, steps 270, 272, 274, 276, 278, 280, 282, 284, and 286 of flowchart 200 of FIG. 2, respectively. For example, structure 370 shows structure 300 after processing step 270, structures 372a and 372b show structure 370 after the processing of step 272, and so forth.

Figure 3B:
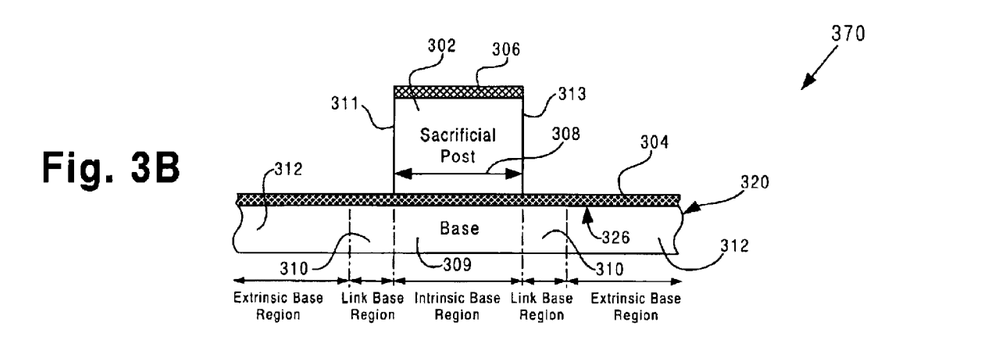
FIG. 3B illustrates a cross-sectional view, which includes a portion of a wafer processed according to an embodiment of the invention, corresponding to step 270 of the flowchart of FIG. 2.

Continuing with step 270 in FIG. 2 and structure 370 in FIG. 3B, step 270 of flowchart 200 comprises the formation of sacrificial post 302 over base oxide layer 304 on top surface 326 of base 320. Base 320 comprises intrinsic base region 309, link base regions 310, and extrinsic base regions 312. Sacrificial post 302 may be formed by patterning and etching a layer of polycrystalline silicon, which may be deposited over base oxide layer 304 by chemical vapor deposition ("CVD"), as known in the art. Although polycrystalline silicon is used in one embodiment of the invention described here, it is manifest that any layer of material that is suitable for accurate patterning using a photomask or other patterning techniques may be used. The suitable material forms a temporary layer of material, i.e. sacrificial post 302, which is etched away prior to formation of an emitter at a later step in the process. To provide greater control and to achieve the smallest possible emitter width, anti-reflective coating ("ARC") layer 306 can be depositing over the layer of polycrystalline silicon before patterning sacrificial post 302 with photoresist. For example, ARC layer 306 may be composed of silicon oxynitride. In one embodiment, ARC layer 306 may not be used. The height of sacrificial post 302 can be, for example, between approximately 500.0 to 3500.0 Angstroms.

As seen below, sacrificial post width 308 determines the width of the emitter of the bipolar transistor formed as the result of the sequence of steps according to one embodiment of the present invention. Base oxide layer 304 prevents damage to base 320 during the etching used to form sacrificial post 302. Base oxide layer 304 may be formed by depositing a layer of silicon oxide, which may be deposited in a PECVD process at a temperature of approximately 350.0 to 450.0° C., for example. In one embodiment, base oxide layer 304 has a thickness of approximately 80.0 Angstroms. In one embodiment, link base regions 310 may be lightly doped by ion implantation to reduce or control the resistance of link base regions 310. The ion implantation doping can be performed through base oxide layer 304, and uses sacrificial post 302 as a mask. It is noted that doping of link base regions 310 is, thus, self-aligned; that is, the doping of link base regions 310 is defined by sides 311 and 313 of sacrificial post 302, and does not depend on the alignment of a photomask. The result of step 270 of flowchart 200 is illustrated by structure 370 in FIG. 3B.

Figure 3C:
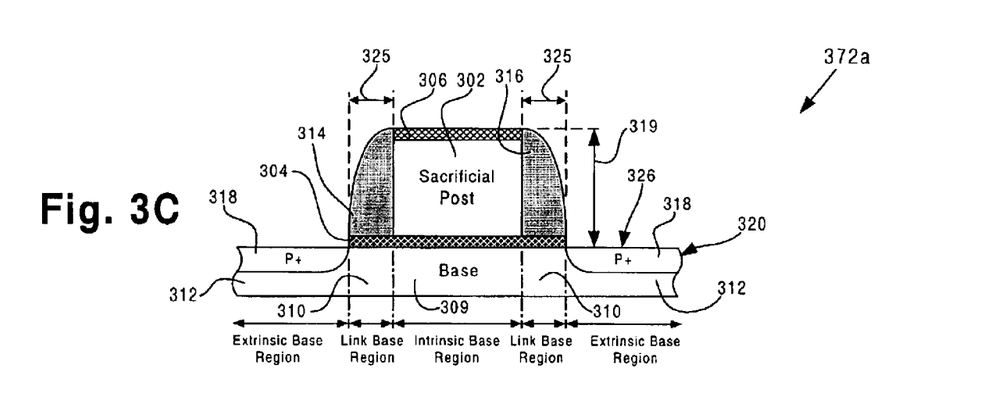
FIG. 3C illustrates a cross-sectional view, which includes a portion of a wafer processed according to an embodiment of the invention, corresponding to step 272 of the flowchart of FIG. 2.
Figure 3D:
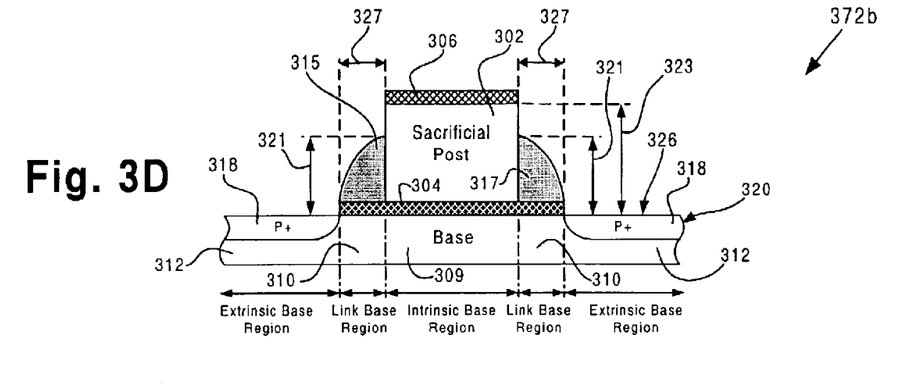
FIG. 3D illustrates a cross-sectional view, which includes a portion of a wafer processed according to an embodiment of the invention, corresponding to step 272 of the flowchart of FIG. 2.

Referring to step 272 in FIG. 2 and structures 372a and 372b in FIGS. 3C and 3D, respectively, at step 272 of flowchart 200, a conformal layer of dielectric such as silicon oxide is deposited over sacrificial post 302. For example, silicon oxide can be deposited at low temperature and pressure using a plasma-enhanced chemical vapor deposition ("PECVD") process. In one embodiment, the deposited conformal layer of silicon oxide is "etched back" to form a pair of oxide spacers, i.e. "full" link spacers 314 and 316 in structure 372a in FIG. 3C. For example, full link spacers 314 and 316 can be formed by anisotropically etching the conformal layer of silicon oxide using a fluorine based etchant, e.g. a $CF_4/CHF_3$ etch. Width 325 of full link spacers 314 and 316, which also determines the boundary of extrinsic base regions 312, is determined by control of deposition thickness of the conformal silicon oxide layer and also by the duration of the etch back process. As a result, the present invention achieves independent control over width 325 of full link spacers 314 and 316. Width 325 of full link spacers 314 and 316 also determines the width of link base regions 310. Height 319 of full link spacers 314 and 316 may be approximately equal to the height of sacrificial post 302. During the "etch back" process portions of base oxide layer 304 outside of full link spacers 314 and 316 are also etched away.

In an alternative embodiment, the deposited conformal layer of silicon oxide is "etched back" to form a pair of recessed oxide spacers, i.e. "recessed" link spacers 315 and 317 in structure 372b of FIG. 3D. Recessed link spacers 315 and 317 can be formed by, for example, anisotropically etching the conformal layer of silicon oxide using a fluorine based etchant, e.g. a $CF_4/CHF_3$ etch. Width 327 of recessed link spacers 315 and 317, which also determines the boundary of extrinsic base regions 312, is determined by control of deposition thickness of the conformal silicon oxide layer and also by the duration of the etch back process. As a result, in such embodiment, the present invention achieves independent control over width 327 of recessed link spacers 315 and 317. Width 327 of recessed link spacers 315 and 317 also determines the width of link base regions 310.

Height 321 of recessed link spacers 315 and 317 is determined by the duration of the etch back process. For example, increasing the duration of the etch back process results in a corresponding decrease in height 321 of recessed link spacers 315 and 317. In this embodiment, height 321 of recessed link spacers 315 and 317 is less than height 323 of sacrificial post 302. In one embodiment, height 321 of recessed link spacers 315 and 317 may be substantially less than height 323 of sacrificial post 302. The difference between height 323 of sacrificial post 302 and height 321 of recessed link spacers 315 and 317 determines the amount of "recess" of recessed link spacers 315 and 317.

After formation of full link spacers 314 and 316 in FIG. 3C or recessed link spacers 315 and 317 in FIG. 3D, extrinsic base regions 312 are doped by ion implantation to reduce the resistance of extrinsic base regions 312. The ion implantation doping uses sacrificial post 302 and full link spacers 314 and 316 in FIG. 3C or recessed link spacers 315 and 317 in FIG. 3D as a mask. Thus, doping of extrinsic base regions 312 is self-aligned, since the doping of exposed extrinsic base regions 312 is defined by the edges of full link spacers 314 and 316 in FIG. 3C or recessed link spacers 315 and 317 in FIG. 3D, and does not depend on the alignment of a photomask. Ion implantation of extrinsic base regions 312 results in heavily doped P+ implanted regions 318 within extrinsic base regions 312. In one embodiment, the dopant used to form implanted regions 318 can be boron.

Figure 3E:
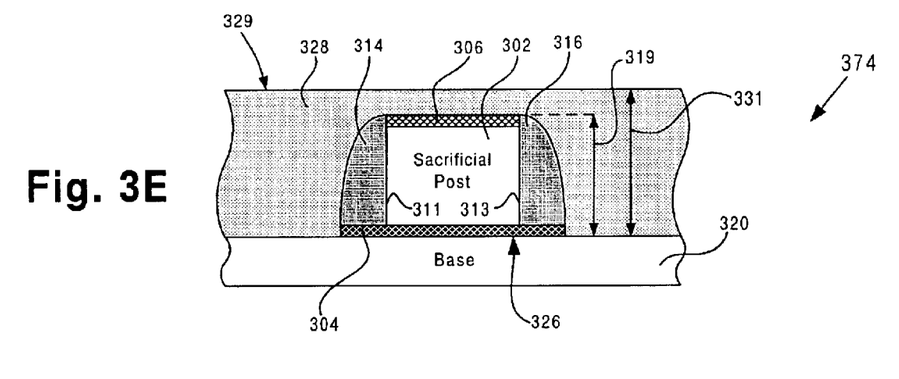
FIG. 3E illustrates a cross-sectional view, which includes a portion of a wafer processed according to an embodiment of the invention, corresponding to step 274 of the flowchart of FIG. 2.

Continuing with step 274 in FIG. 2 and structure 374 in FIG. 3E, at step 274 of flowchart 200, non-sacrificial planarizing layer 328 is deposited over ARC layer 306 on sacrificial post 302, full link spacers 314 and 316 in FIG. 3C or recessed link spacers 315 and 317 in FIG. 3D, and top surface 326 of base 320. It is noted that FIGS. 3E through 3K remaining in the present application are described in relation to the embodiment of the invention utilizing "full" spacers as shown in FIG. 3C, as opposed to the embodiment utilizing "recessed" spacers shown in FIG. 3D. However, reference to full spacers to describe the present invention is only exemplary since the present invention and the process steps discussed in flowchart 200 apply to recessed spacers as well as to full spacers. As such, FIGS. 3E through 3K could have illustrated the invention by reference to recessed spacers. However, as stated above, to describe the inventive concepts in the present application by reference to a specific example, full spacers are utilized for illustration and discussion in relation to FIGS. 3E through 3K.

In the present embodiment, non-sacrificial planarizing layer 328 is deposited using a spin-on process and can comprise silicate glass. Planarizing layer 328 exhibits a "planarizing" property by coating tall features of structure 374, such as sacrificial post 302, thinly, while providing a thicker coating over shorter features. As such, top surface 329 of non-sacrificial planarizing layer 328 is substantially flat or planar.

In the present embodiment, height 331 of non-sacrificial planarizing layer 328 can be greater than height 319 of full link spacers 314 and 316. In one embodiment, height 331 of non-sacrificial planarizing layer 328 can be approximately equal to height 319 of full link spacers 314 and 316. The maximum height 331 of non-sacrificial planarizing layer 328 can be approximately 5000.0 Angstroms. Referring to FIG. 3E, the result of step 274 of flowchart 200 is illustrated by structure 374.

Figure 3F:
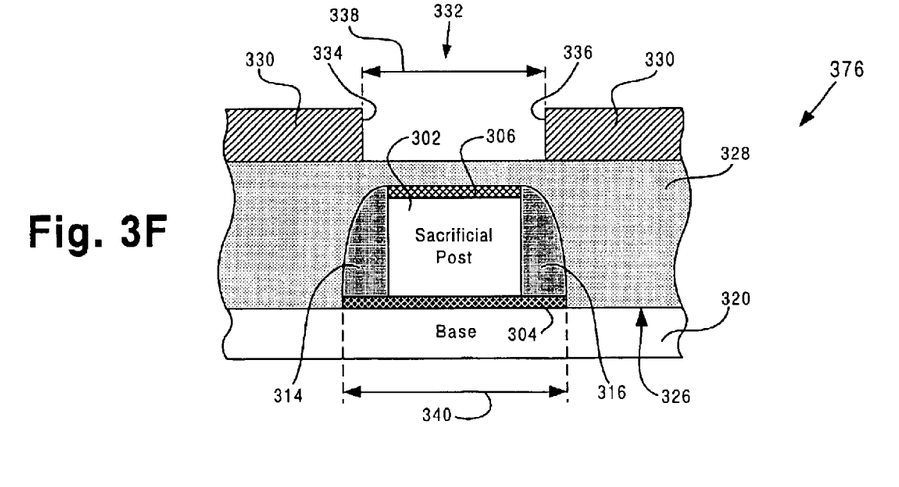
FIG. 3F illustrates a cross-sectional view, which includes a portion of a wafer processed according to an embodiment of the invention, corresponding to step 276 of the flowchart of FIG. 2.

Continuing with step 276 in FIG. 2 and structure 376 in FIG. 3F, at step 276 of flowchart 200, mask 330 is deposited on non-sacrificial planarizing layer 328 and emitter window opening 332 is patterned in mask 330. In the present embodiment, mask 330 comprises photoresist. In another embodiment, mask 330 may comprise another suitable material as is known by a person of ordinary skill in the art. In one embodiment, prior to deposition of the layer of masking material, a layer of organic material, such as an organic BARC, can be deposited over non-sacrificial planarizing layer 328 to act as an anti-reflective coating layer, which can reduce unwanted reflections during patterning of emitter window opening 332.

Figure 3G:
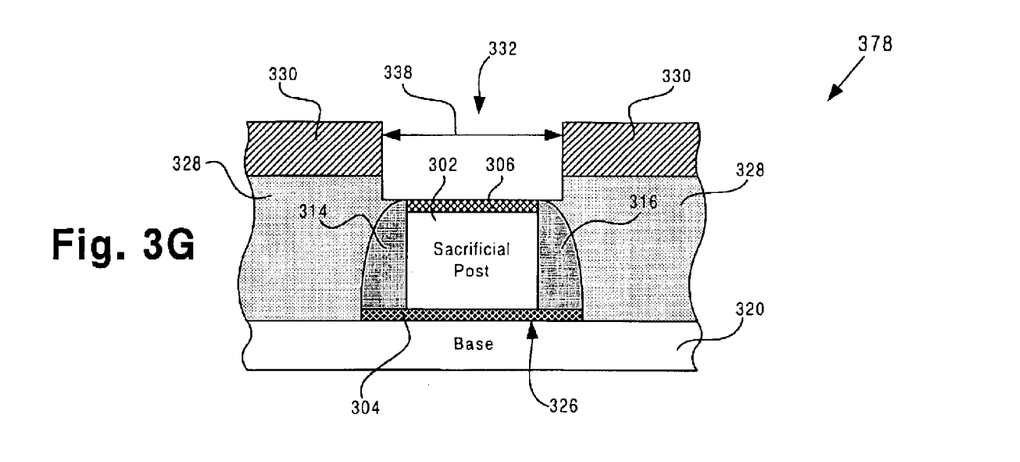
FIG. 3G illustrates a cross-sectional view, which includes a portion of a wafer processed according to an embodiment of the invention, corresponding to step 278 of the flowchart of FIG. 2.

As described above, non-sacrificial planarizing layer 328 provides a thin layer of material over sacrificial post 302 and a thicker layer of material over shorter regions of structure 376 adjacent to full link spacers 314 and 316. Thus, emitter window opening width 338 can be greater than the distance between the outside edges of full link spacers 314 and 316, i.e. width 340, since sacrificial post 302 and full link spacers 314 and 316 will be exposed first during a subsequent etching process, while shorter regions of structure 378 will remain protected by the thicker layer of material provided by non-sacrificial planarizing layer 328. In one embodiment, emitter window opening width 338 can be less than width 340, i.e. the distance between the outside edges of full link spacers 314 and 316.

Thus, the present invention does not require edges 334 and 336 of emitter window opening 332 to be situated over full link spacers 314 and 316, respectively, so that full link spacers 314 and 316 can protect the region of structure 376 beneath full link spacers 314 and 316 during subsequent etching steps. As a result, the present invention advantageously achieves increased flexibility in width 338 of emitter window opening 332. Thus, by providing an emitter window opening that can be made sufficiently large, the present invention advantageously achieves an emitter window opening that requires minimal dimensional and alignment accuracy. In other words, critical dimension control of emitter window opening 332 is relaxed.

Moreover, absent the technique of the present invention, if the center of emitter window opening 332 is not properly aligned with the center of sacrificial post 302, the resulting misalignment can create undesirable device properties, which can reduce manufacturing yield. For example, absent the present invention's technique, misalignment of the center of emitter window opening 332 and the center of sacrificial post 302 can cause edge 334 or edge 336 of emitter window opening 332 to be situated too close to sacrificial post 302, which can create undesirable device properties and cause decreased manufacturing yield. However, according to the present invention, the width of emitter window opening 332 can be increased sufficiently to accommodate alignment error between the center of emitter window opening 332 and the center of sacrificial post 302. Thus, the present invention achieves a bipolar transistor having improved manufacturability, which advantageously results in increased manufacturing yield.

By providing a sufficiently large emitter window opening width, the present invention achieves an emitter window opening that is practically self-aligning over sacrificial post 302. In fact, in one embodiment, the thickness of non-sacrificial planarizing layer 328 over sacrificial post 302 can be reduced to an appropriate thickness such that mask 330 is not even required. Thus, since the thin non-sacrificial planarizing layer 328 situated over sacrificial post 302 is etched first in a subsequent etching step, the resulting emitter window opening is self-aligned over sacrificial post 302. In other words, in that embodiment, no mask is required to align the emitter window opening over sacrificial post 302. Referring to FIG. 3F, the result of step 276 of flowchart 200 is illustrated by structure 376.

Continuing with step 278 in FIG. 2 and structure 378 in FIG. 3G, at step 278 of flowchart 200, non-sacrificial planarizing layer 328 is removed in emitter window opening 332 to expose ARC layer 306 and extend emitter window opening 332. Non-sacrificial planarizing layer 328 may be removed using, for example, oxide etchants utilizing a chemistry comprising carbon, hydrogen, and fluorine or other appropriate etchants as known in the art. Referring to FIG. 3G, the result of step 278 of flowchart 200 is illustrated by structure 378.

Figure 3H:
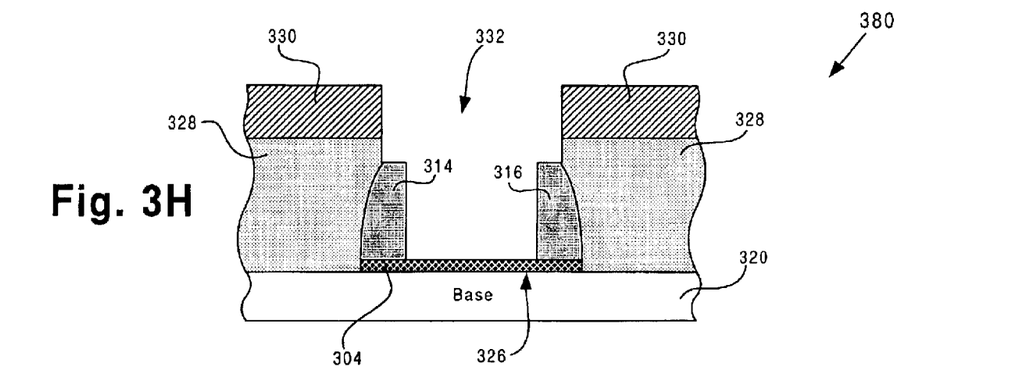
FIG. 3H illustrates a cross-sectional view, which includes a portion of a wafer processed according to an embodiment of the invention, corresponding to step 280 of the flowchart of FIG. 2.

Continuing with step 280 in FIG. 2 and structure 380 in FIG. 3H, at step 280 of flowchart 200, ARC layer 306 and sacrificial post 302 are removed in emitter window opening 332 to expose base oxide 304 and further extend emitter window opening 332. For example, ARC layer 306 may be removed using a reactive ion etch stopping on sacrificial post 302. Sacrificial post 302 may be removed, for example, using a chlorine based etch that stops on base oxide layer 304. Referring to FIG. 3H, the result of step 280 of flowchart 200 is illustrated by structure 380.

Figure 3I:
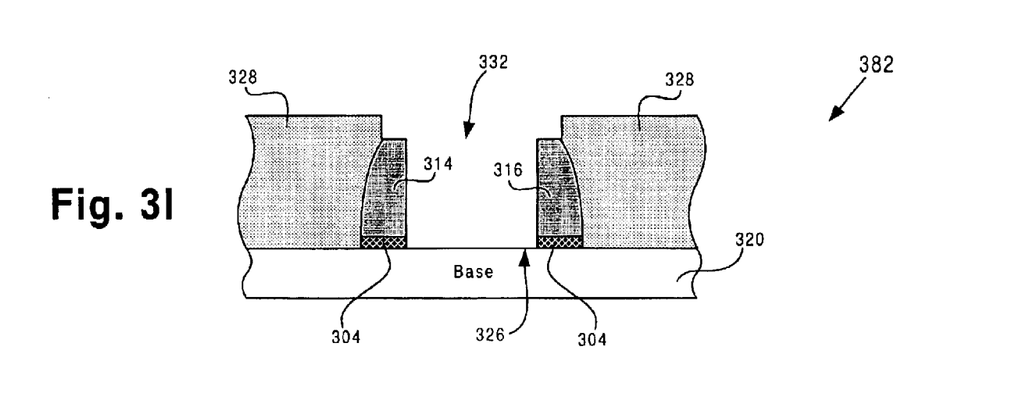
FIG. 3I illustrates a cross-sectional view, which includes a portion of a wafer processed according to an embodiment of the invention, corresponding to step 282 of the flowchart of FIG. 2.

Continuing with step 282 in FIG. 2 and structure 382 in FIG. 3I, at step 282 of flowchart 200, the portion of base oxide layer 304 situated between full link spacer 314 and full link spacer 316 is removed to complete formation of emitter window opening 332 and mask 330 is removed. Base oxide layer 304 may be removed, for example, with a wet strip such as a hydrogen fluoride ("HF") dip. An HF dip will also smooth out the top of full link spacers 314 and 316, which have been roughened by the previous etching processes used to remove ARC layer 306 and sacrificial post 302. Mask 330 may be removed, for example, using a plasma etch in a downstream microwave plasma process as known in the art. Referring to FIG. 3I, the result of step 282 of flowchart 200 is illustrated by structure 382.

Figure 3J:
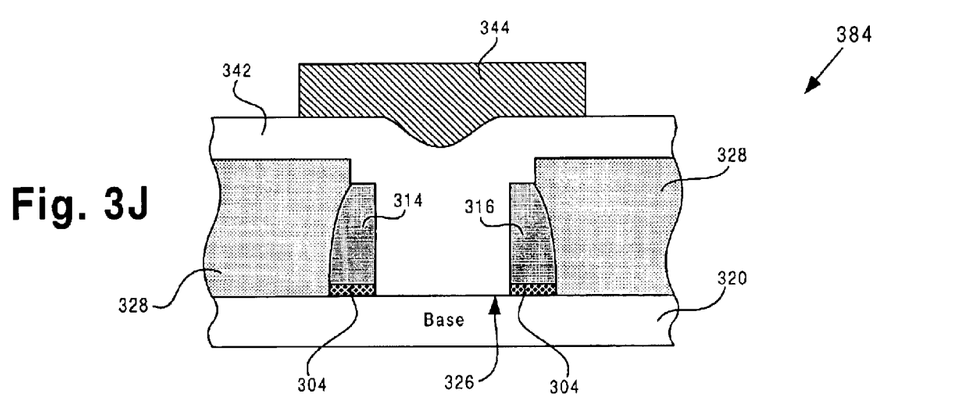
FIG. 3J illustrates a cross-sectional view, which includes a portion of a wafer processed according to an embodiment of the invention, corresponding to step 284 of the flowchart of FIG. 2.

Referring to step 284 in FIG. 2 and structure 384 in FIG. 3J, at step 284 of flowchart 200, emitter layer 342 is deposited on top surface 326 of base 320 in emitter window opening 332, over exposed portions of full link spacers 314 and 316, and over non-sacrificial planarizing layer 328. Emitter layer 342 can comprise polycrystalline silicon and may be deposited by a CVD process, as known in the art. In one embodiment, emitter layer 342 can comprise N type polycrystalline silicon. Next, mask 344 is formed over emitter layer 342 in a manner known in the art. In the present embodiment, mask 344 comprises photoresist. In another embodiment, mask 344 may comprise another suitable material as is known by a person of ordinary skill in the art. Mask 344 is utilized to form an emitter in a subsequent processing step discussed below. Referring to FIG. 3J, the result of step 284 of flowchart 200 is illustrated by structure 384.

Figure 3K:
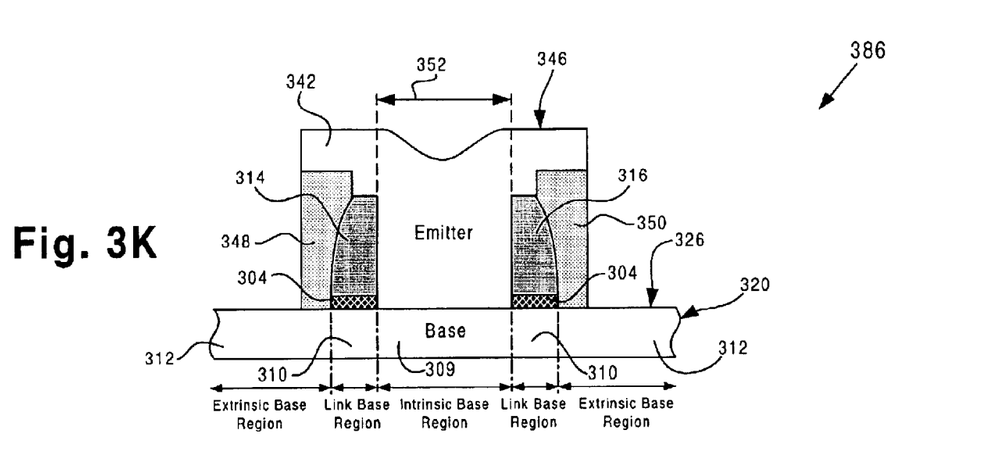
FIG. 3K illustrates a cross-sectional view, which includes a portion of a wafer processed according to an embodiment of the invention, corresponding to step 286 of the flowchart of FIG. 2.

Referring to step 286 in FIG. 2 and structure 386 in FIG. 3K, at step 286 of flowchart 200, emitter 346 is formed, portions of non-sacrificial planarizing layer 328 are removed, and mask 344 is removed. Emitter 346 can be formed by etching portions of emitter layer 342 not covered by mask 344 utilizing an etchant comprising, for example, chlorine and HBr. Unprotected portions of non-sacrificial planarizing layer 328 can then be removed by utilizing an etchant having a chemistry comprising, for example, hydrogen, carbon, and flourine to form non-sacrificial planarizing layer portions 348 and 350. Non-sacrificial planarizing layer portions 348 and 350 are situated adjacent to full link spacers 314 and 316, respectively, on top surface 326 of base 320. Non-sacrificial planarizing layer portions 348 and 350 are also situated over extrinsic base regions 312. Emitter width 352 of emitter 346 is substantially equal to sacrificial post width 308 in FIG. 3B. Also, emitter 346 is self-aligned by full link spacers 314 and 316 to extrinsic base regions 312. At step 286, mask 344 is also removed. Similar to mask 330, mask 344 may also be removed, for example, using a plasma etch in a downstream microwave plasma process. Subsequent steps of forming contacts, as well as other steps, can be performed as known in the art. Referring to FIG. 3K, the result of step 286 of flowchart 200 is illustrated by structure 386.

Thus, as discussed above, the present invention provides a self-aligned bipolar transistor having either full or recessed link spacers and utilizing a non-sacrificial planarizing layer to advantageously achieve increased tolerance for misalignment error. Furthermore, by utilizing a single layer, i.e. a non-sacrificial planarizing layer, to achieve increased tolerance for misalignment error, the present invention advantageously achieves a self-aligned bipolar transistor having increased manufacturability.

Additionally, in the present invention, non-sacrificial planarizing layer portions 348 and 350 are situated between portions of emitter 346 situated over non-sacrificial planarizing layer portions 348 and 350 and extrinsic base regions 312. As a result, the present invention advantageously achieves a self-aligned bipolar transistor having sufficient separation between emitter portions and extrinsic base regions to significantly reduce base-emitter capacitance and leakage.

Furthermore, in an embodiment of the present invention utilizing recessed link spacers, the invention achieves an emitter topography that remains symmetric even if the center of emitter window opening is not properly aligned with the center of the sacrificial post. The reason is that the recessed link spacers are too short to be reached and potentially etched away and, thus, the asymmetric etching away that can potentially occur with full link spacers is avoided when using recessed link spacers. As a result, in the recessed link spacer embodiment, the present invention advantageously achieves a symmetric emitter topography that provides increased manufacturability. Moreover, in the embodiment of the present invention utilizing recessed link spacers, the height of the emitter is reduced to advantageously reduce dependence of bipolar transistor performance on emitter height.

It is appreciated by the above detailed disclosure that the invention provides method for fabrication of a self-aligned bipolar transistor achieving improved manufacturability by providing an emitter window opening requiring minimal critical dimension control and having increased tolerance for misalignment error. Although the invention is described as applied to the fabrication of a bipolar transistor, it will be readily apparent to a person of ordinary skill in the art how to apply the invention in a similar situation where improved alignment tolerance and a reduction in critical dimension control is desirable.

From the description of the above invention it is evident that various techniques can be used for implementing the concepts of the present invention without departing from its scope and spirit. Moreover, while the invention has been described with specific reference to certain embodiments, a person of ordinary skills in the art would recognize that changes made in form and detail without departing from the spirit and scope of the invention. The described embodiments are to be considered in all respects as illustrative and not restrictive. Therefore, it should be understood that the invention is not limited to the particular embodiments described herein, but is capable of many rearrangements, modifications, and substitutions without departing from the scope of the invention.

Thus, method for fabricating a self-aligned bipolar transistor with planarizing layer and related structure have been described.

What is claimed is:

1. A bipolar transistor comprising:
a base having a top surface;
a first link spacer and a second link spacer situated on said top surface of said base;
a sacrificial post situated on said top surface of said base and having a sacrificial post width, said sacrificial post being situated between said first link spacer and said second link spacer;
a non-sacrificial planarizing layer situated over said sacrificial post, said first and said second link spacers, and said base;
wherein said sacrificial post width defines an emitter window opening having a width, wherein said width of said emitter window opening includes said sacrificial post width in its entirety.

2. The bipolar transistor of claim 1 wherein each of said first and said second link spacers has a respective height approximately equal to a height of said sacrificial post.

3. The bipolar transistor of claim 1 wherein each of said first and said second link spacers has a respective height substantially less than a height of said sacrificial post.

4. The bipolar transistor of claim 1 wherein said non-sacrificial planarizing layer comprises silicate glass.

5. The bipolar transistor of claim 1 wherein said non-sacrificial planarizing layer has a height approximately equal to a height of said first and said second link spacers.

6. The bipolar transistor of claim 1 wherein said non-sacrificial planarizing layer has a height greater than a height of said first and said second link spacers.

7. The bipolar transistor of claim 1 further comprising a mask situated over said non-sacrificial planarizing layer, said mask having said emitter window opening.

8. A method for fabricating a bipolar transistor, said method comprising steps of:
fabricating a sacrificial post on a top surface of a base, said sacrificing post having a sacrificial post width;
forming a first link spacer and a second link spacer on respectively a first side and a second side of said sacrificial post;
depositing a non-sacrificial planarizing layer over said first and said second link spacers, said sacrificial post, and said base;
defining an emitter window opening having a width, wherein said width of said emitter window opening includes said sacrificial post width in its entirety.

9. The method of claim 8 wherein each of said first and said second link spacers has a respective height approximately equal to a height of said sacrificial post.

10. The method of claim 8 wherein each of said first and said second link spacers has a respective height substantially less than a height of said sacrificial post.

11. The method of claim 8 wherein said non-sacrificial planarizing layer comprises silicate glass.

12. The method of claim 8 wherein said step of depositing said non-sacrificial planarizing layer is performed by a spin-on process.

13. The method of claim 8 wherein said non-sacrificial planarizing layer has a height approximately equal to a height of said first and said second link spacers.

14. The method of claim 8 wherein said non-sacrificial planarizing layer has a height greater than a height of said first and said second link spacers.

15. A bipolar transistor comprising:
a base having a top surface;
a first link spacer and a second link spacer situated on said top surface of said base defining a spacer distance therebetween;
an emitter situated on said top surface of said base, said emitter being situated between said first link spacer and said second link spacer and having an emitter width, wherein said emitter width includes said spacer distance;
a first non-sacrificial planarizing layer portion and a second non-sacrificial planarizing layer portion situated on said top surface of said base, said first non-sacrificial planarizing layer portion being situated adjacent to said first link spacer and said second non-sacrificial planarizing layer portion being situated adjacent to said second link spacer.

16. The bipolar transistor of claim 15 wherein said first and said second link spacers are recessed link spacers.

17. The bipolar transistor of claim 15 wherein said first and said second link spacers are full link spacers.

18. The bipolar transistor of claim 15 wherein said first and said second non-sacrificial planarizing layer portions comprise silicate glass.

19. The bipolar transistor of claim 15 wherein each of said first and said second non-sacrificial planarizing layer portions has a respective height approximately equal to a height of said first and said second link spacers.

20. The bipolar transistor of claim 15 wherein each of said first and said second non-sacrificial planarizing layer portions has a respective height greater than a height of said first and said second link spacers.

21. The bipolar transistor of claim 1 wherein said width of said emitter window opening includes at least a portion of a width of each of said first and said second link spacers.

22. The bipolar transistor of claim 1 further comprising an oxide layer situated on said top surface of said base, wherein said sacrificial post is situated on said oxide layer.

23. The bipolar transistor of claim 1 further comprising an anti-reflective coating layer deposited over said sacrificial post, wherein said non-sacrificial planarizing layer is situated over said anti-reflective coating layer.

24. The method of claim 8 wherein said width of said emitter window opening includes at least a portion of a width of each of said first and said second link spacers.

25. The method of claim 8 further comprising forming an oxide layer on said top surface of said base prior to said fabricating said sacrificial post.

26. The method of claim 8 further comprising depositing an anti-reflective coating layer deposited over said sacrificial post prior to said depositing said non-sacrificial planarizing.

27. The bipolar transistor of claim 15 further comprising an oxide layer situated on said top surface of said base, wherein said first link space and said second link spacer are situated on said oxide layer.

* * * * *